United States Patent
Ragle

(10) Patent No.: US 6,545,298 B2
(45) Date of Patent: Apr. 8, 2003

(54) COMPOUND SEMICONDUCTOR RECTIFIER DEVICE STRUCTURE

(75) Inventor: Larry Ragle, Palo Alto, CA (US)

(73) Assignee: The Fox Group, Inc., Livermore, CA (US)

( * ) Notice: Subject to any disclaimer, the term of this patent is extended or adjusted under 35 U.S.C. 154(b) by 0 days.

(21) Appl. No.: 10/004,496

(22) Filed: Oct. 23, 2001

(65) Prior Publication Data

US 2002/0125496 A1 Sep. 12, 2002

Related U.S. Application Data

(60) Provisional application No. 60/244,127, filed on Oct. 26, 2000.

(51) Int. Cl.$^7$ ............................................. H01L 31/109
(52) U.S. Cl. ........................ 257/183; 257/471; 257/485; 257/653
(58) Field of Search .......................... 257/12, 13, 44, 257/77, 94, 96, 97, 183, 189, 199, 200, 449, 450, 453, 454, 455, 456, 458, 461, 471, 472, 473, 485, 486, 603, 653, 654

(56) References Cited

U.S. PATENT DOCUMENTS

| | | | | |
|---|---|---|---|---|
| 4,370,510 A | * | 1/1983 | Stirn | 136/262 |
| 4,385,198 A | * | 5/1983 | Rahilly | 136/249 |
| 4,414,558 A | * | 11/1983 | Nishizawa et al. | 357/17 |
| 4,570,172 A | * | 2/1986 | Henry et al. | 357/17 |
| 4,960,731 A | * | 10/1990 | Spitz et al. | 437/152 |
| 5,773,858 A | * | 6/1998 | Schlangenotto et al. | 257/212 |

* cited by examiner

Primary Examiner—Sara Crane
(74) Attorney, Agent, or Firm—Bingham McCutchen, LLP; David G. Beck

(57) ABSTRACT

A rectifier structure that exhibits a low turn-on voltage and allows rapid switching without ringing is provided. The structure utilizes a thin epitaxial layer interposed between the two layers comprising the rectifier junction. Preferably the epitaxial layer is of the same conductivity as the underlying layer while being comprised of the same material as the outermost layer.

11 Claims, 2 Drawing Sheets

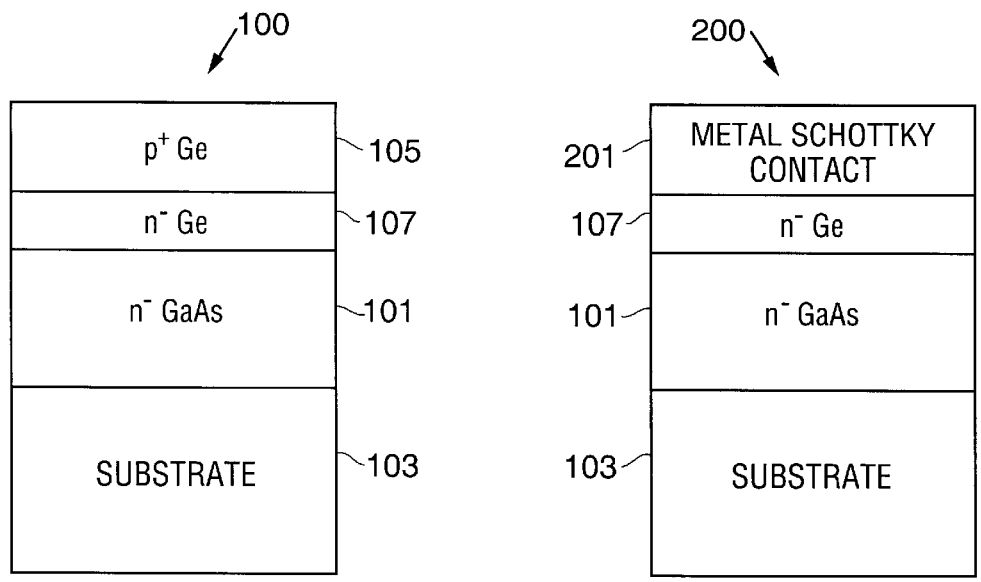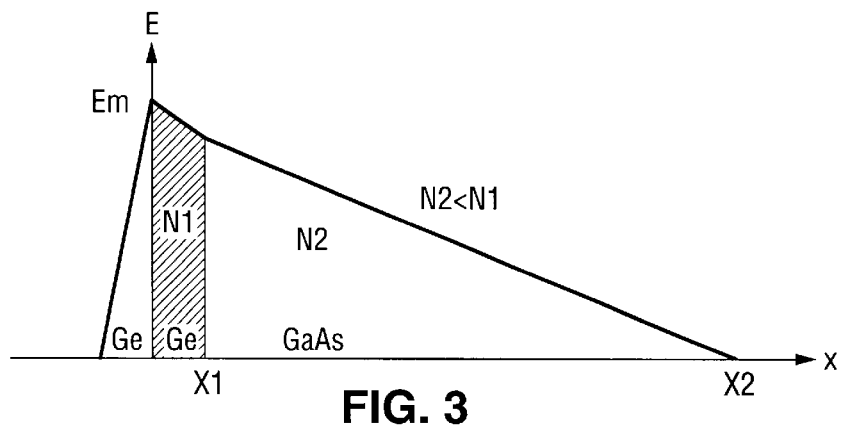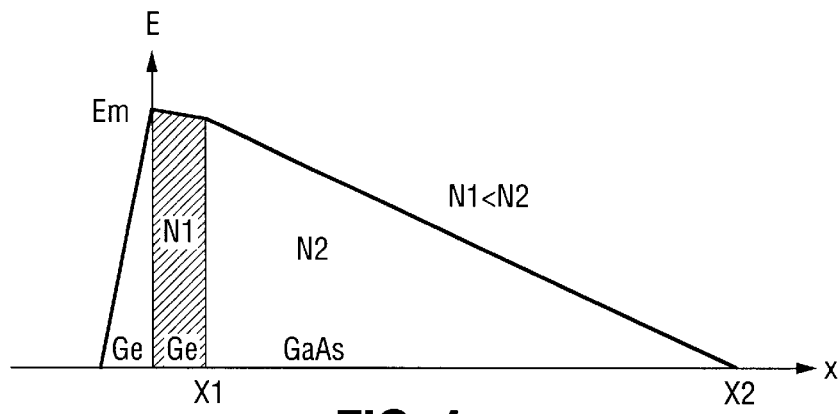

US 6,545,298 B2

COMPOUND SEMICONDUCTOR RECTIFIER DEVICE STRUCTURE

CROSS-REFERENCES TO RELATED APPLICATIONS

This application claims the benefit of U.S. Patent Application Serial No. 60/244,127 filed Oct. 26, 2000.

BACKGROUND OF THE INVENTION

In power supply circuitry it is desirable to design the rectifier diodes such that when they are in the 'on' state, they possess a very small forward voltage drop and when they are switched rapidly to the 'off' state, they do so without ringing. Additionally the rectifier diodes must be designed to have the required breakdown voltage. Unfortunately designers have found it difficult to design rectifier diodes with all of the desired characteristics. For example, germanium based diodes, regardless of whether they are PIN or Schottky structures, exhibit a low turn-on voltage relative to silicon diodes due to their small bandgap. On the other hand, gallium arsenide based diodes, which have a relatively high turn-on voltage due to their large bandgap, exhibit high current density relative to either silicon or germanium due to their high mobility and are capable of rapid switching without ringing.

Accordingly, what is needed in the art is a rectifier structure that has a low turn-on voltage and can be rapidly switched without ringing. The present invention provides such a structure.

SUMMARY OF THE INVENTION

The present invention provides a rectifier structure that exhibits a low turn-on voltage while allowing rapid switching without ringing. According to the invention, a thin epitaxial layer is interposed between the two layers that comprise the rectifier junction. Preferably the epitaxial layer is of the same conductivity as the underlying layer while being comprised of the same material as the outermost layer. As the layer is epitaxially grown, preferably the lattice of the material comprising the layer is a close match to that of the underlying layer, thus allowing the as-grown layer to be of high quality.

The present invention can be used with a variety of semiconductor material pairs, in particular material pairs in which one member has a relatively small bandgap and the other member has a relatively high mobility. As the smaller bandgap material sets the maximum field for the device, typically devices fabricated in accordance with the present invention are primarily useful in low voltage applications.

A further understanding of the nature and advantages of the present invention may be realized by reference to the remaining portions of the specification and the drawings.

BRIEF DESCRIPTION OF THE DRAWINGS

FIG. 1 is an illustration of an embodiment of the invention utilizing an $n^-$ Ge layer with the outermost layer comprised of $p^+$ Ge;

FIG. 2 is an illustration of an alternate embodiment of the invention utilizing an $n^-$ Ge layer and an outermost layer comprised of a metal Schottky contact;

FIG. 3 is a graph illustrating the electric field versus distance for the embodiment illustrated in FIG. 1 in which the concentration of $n^-$ impurities is less in the $n^-$ GaAs layer than in the $p^+$ Ge layer;

FIG. 4 is a graph illustrating the electric field versus distance for the embodiment illustrated in FIG. 1 in which the concentration of $n^-$ impurities is greater in the $n^-$ GaAs layer than in the $p^+$ Ge layer;

DESCRIPTION OF THE SPECIFIC EMBODIMENTS

Figure 5:
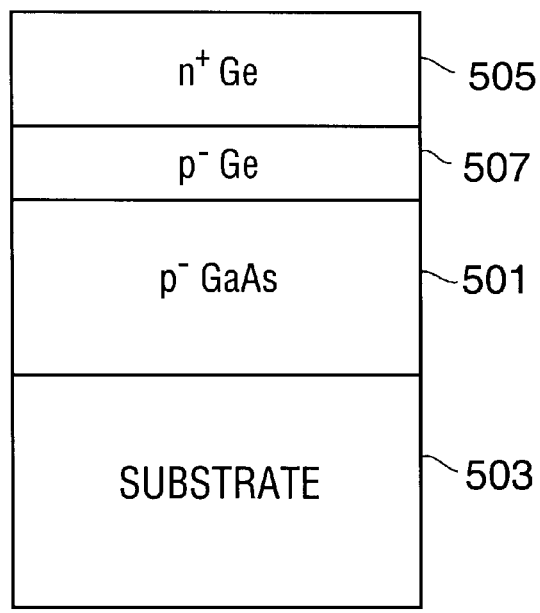
FIG. 5 is an illustration of an embodiment of the invention utilizing an $p^-$ Ge layer with the outermost layer comprised of $n^+$ Ge.

The rectifier structure of the present invention exhibits a low turn-on voltage while allowing rapid switching without ringing. An additional benefit of the disclosed design is the reduced manufacturing cost which results, at least in part, from the ability to have a smaller die area than is possible with either a silicon or germanium diode according to the prior art.

According to the invention, a thin epitaxial layer is interposed between the two layers that comprise the rectifier junction. Preferably the epitaxial layer is of the same conductivity as the underlying layer while being comprised of the same material as the outermost layer. As the layer is epitaxially grown, preferably the lattice of the material comprising the layer is a close match to that of the underlying layer, thus allowing the as-grown layer to be of high quality.

FIG. 1 is an illustration of one embodiment of the invention. As shown, an $n^-$ GaAs layer 101 is grown on a substrate 103, substrate 103 preferably being comprised of either $n^+$ Ge or n+GaAs. Interposed between $n^-$ GaAs layer 101 and the junction's $p^+$ Ge layer 105 is an $n^-$ Ge layer 107. The thickness of layer 107 is much less than underlying layer 101. Preferably the thickness of layer 107 is approximately 1 micrometer or less.

FIG. 2 is an illustration of another embodiment of the invention. The only difference between this embodiment and the prior embodiment is the replacement of $p^+$ Ge layer 105 with a metallic Schottky contact 201.

The inclusion of layer 107 into either structure 100 or structure 200 has only a small influence on the device's breakdown voltage as illustrated in FIGS. 3 and 4. The breakdown voltage is the integrated area under the curves shown in these figures. Note that in both illustrated cases, the thickness of $n^-$ Ge layer 107 is assumed to be small relative to that of $n^-$ GaAs layer 101. In FIG. 3 the concentration of $n^-$ impurities is less in layer 101 than in layer 107 while in FIG. 4 this concentration gradient is reversed. Preferably the concentration gradient is as illustrated in FIG. 3 since a large carrier concentration in the $n^-$ Ge layer 107 compensates for the reduced carrier mobility in the Ge/GaAs region.

The present invention is not limited to the embodiments shown above, rather it is applicable to a variety of semiconductor material pairs in which one member has a relatively small bandgap and the other member has a relatively high mobility. The maximum field for a device designed in accordance with the present invention is set by the material with the smaller bandgap, as such a material will normally have a relatively low dielectric breakdown field. For example, the field for Ge is 105 volts per centimeter while the field for GaAs is $4 \times 10^5$ volts per centimeter. Accordingly, devices designed in accordance with the present invention are primarily useful in low voltage applications (e.g., less than 200 volts). As previously noted, preferably the two materials have a good lattice match, thus allowing the epitaxial layer growth to be of high quality.

Figure 6:
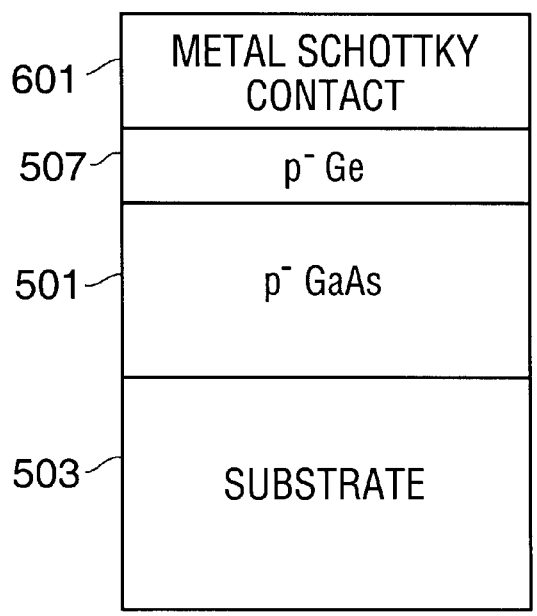
FIG. 6 is an illustration of an alternate embodiment of the invention utilizing an $p^-$ Ge layer and an outermost layer comprised of a metal Schottky contact.

FIGS. 5 and 6 illustrate another embodiment of the invention in which a p⁻ GaAs layer 501 is grown on a substrate 503, substrate 503 preferably being comprised of either p⁺ Ge or p⁺ GaAs. As shown in FIG. 5, interposed between p⁻ GaAs layer 501 and the junction's n⁺ Ge layer 505 is a p⁻ Ge layer 507. Alternately as shown in FIG. 6, p⁻ Ge layer 507 is interposed between p⁻ GaAs layer 501 and a metallic Schottky contact layer 601. As in the prior embodiments, the thickness of layer 507 is preferably equal to or less than 1 micrometer in thickness.

As will be understood by those familiar with the art, the present invention may be embodied in other specific forms without departing from the spirit or essential characteristics thereof. Accordingly, the disclosures and descriptions herein are intended to be illustrative, but not limiting, of the scope of the invention which is set forth in the following claims.

What is claimed is:

1. A rectifier diode comprising:
   a substrate;
   a first semiconductor layer grown on said substrate, said first semiconductor layer comprised of a first semiconductor material of a first conductivity type, a first mobility, and a first bandgap;
   a second semiconductor layer epitaxially grown on said first semiconductor layer, said second semiconductor layer comprised of a second semiconductor material of said first conductivity type, wherein said second semiconductor layer is approximately 1 micrometer or less in thickness; and
   a third semiconductor layer epitaxially grown on said second semiconductor layer, wherein said third semiconductor layer is comprised of said second semiconductor material and is of a second conductivity type, a second mobility, and a second bandgap, wherein said second bandgap is less than said first bandgap and wherein said first mobility is higher than said second mobility.

2. A rectifier diode comprising:
   a substrate;
   a first semiconductor layer grown on said substrate, said first semiconductor layer comprised of a gallium arsenide material of a first conductivity type;
   a second semiconductor layer epitaxially grown on said first semiconductor layer, said second semiconductor layer comprised of a germanium material of said first conductivity type, wherein said second semiconductor layer is approximately 1 micrometer or less in thickness; and
   a third semiconductor layer epitaxially grown on said second semiconductor layer, wherein said third semiconductor layer is comprised of said germanium material and is of a second conductivity type.

3. The rectifier diode of claim 2, wherein said first conductivity type is n⁻ and said second conductivity type is p⁺.

4. The rectifier diode of claim 2, wherein said first conductivity type is p⁻ and said second conductivity type is n⁺.

5. The rectifier diode of claim 2, wherein said substrate is comprised of said germanium material.

6. The rectifier diode of claim 2, wherein said substrate is comprised of said gallium arsenide material.

7. A rectifier diode comprising:
   a substrate;
   a first semiconductor layer grown on said substrate, said first semiconductor layer comprised of a gallium arsenide material of a first conductivity type;
   a second semiconductor layer epitaxially grown on said first semiconductor layer, said second semiconductor layer comprised of a germanium material of said first conductivity type, wherein said second semiconductor layer is approximately 1 micrometer or less in thickness; and
   a metal Schottky contact deposited on said second semiconductor layer.

8. The rectifier diode of claim 7, wherein said first conductivity type is n⁻.

9. The rectifier diode of claim 8, wherein said first conductivity type is p⁻.

10. The rectifier diode of claim 8, wherein said substrate is comprised of said germanium material.

11. The rectifier diode of claim 8, wherein said substrate is comprised of said gallium arsenide material.

* * * * *